(12) United States Patent
du Pau et al.

(10) Patent No.: US 8,231,931 B2
(45) Date of Patent: Jul. 31, 2012

(54) METHOD AND APPARATUS FOR ACCURATELY APPLYING STRUCTURES TO A SUBSTRATE

(75) Inventors: Cornelis Petrus du Pau, Eindhoven (NL); Marinus Franciscus J. Evers, Heeze (NL); Peter Briër, Eindhoven (NL)

(73) Assignee: OTB Solar B.V., Eindhoven (NL)

( * ) Notice: Subject to any disclaimer, the term of this patent is extended or adjusted under 35 U.S.C. 154(b) by 781 days.

(21) Appl. No.: 11/578,247

(22) PCT Filed: Apr. 22, 2005

(86) PCT No.: PCT/NL2005/000298
§ 371 (c)(1),
(2), (4) Date: Aug. 27, 2007

(87) PCT Pub. No.: WO2005/104637
PCT Pub. Date: Nov. 3, 2005

(65) Prior Publication Data
US 2008/0158282 A1    Jul. 3, 2008

(30) Foreign Application Priority Data

Apr. 23, 2004  (NL) ...................................... 1026013
Aug. 19, 2004  (NL) ...................................... 1026880

(51) Int. Cl.
*C23D 5/12* (2006.01)
(52) U.S. Cl. ......... 427/58; 427/60; 427/110; 427/126.1; 430/30; 430/311; 430/320
(58) Field of Classification Search .................... 427/58, 427/60, 110, 126.1; 430/30, 311, 320
See application file for complete search history.

(56) References Cited

U.S. PATENT DOCUMENTS

| 5,932,012 A | 8/1999 | Yukihira et al. | |
| 6,165,658 A * | 12/2000 | Taff et al. | 430/30 |
| 6,354,700 B1 * | 3/2002 | Roth | 347/103 |
| 7,087,352 B2 * | 8/2006 | Fay et al. | 430/22 |
| 2003/0228543 A1 * | 12/2003 | Sawano et al. | 430/311 |

FOREIGN PATENT DOCUMENTS

| EP | 930 641 A | 7/1999 |
| EP | 0930641 A2 * | 7/1999 |
| EP | 1 223 615 A | 7/2002 |
| GB | 2 350 321 A | 11/2000 |
| JP | 2001-337461 A | 12/2001 |
| JP | 2004-126181 A | 4/2004 |
| WO | WO 02/098573 A | 12/2002 |

* cited by examiner

*Primary Examiner* — Nadine G Norton
*Assistant Examiner* — Maki Angadi
(74) *Attorney, Agent, or Firm* — Pillsbury Winthrop Shaw Pittman LLP

(57) ABSTRACT

A method wherein a substrate is provided, wherein, in a scanning step, structures already applied to the substrate are detected by at least one scanning provision of a processing head, wherein the processing head is provided with at least one lighting provision, which lighting provision locally lights the applied lacquer structure in a lighting step by using the information obtained with the scanning step. Further, the invention discloses an apparatus for carrying out the method is described, which apparatus is provided with a processing head which is movable relative to a substrate carrier, wherein the processing head comprises at least one scanning provision and at least one lighting provision.

46 Claims, 7 Drawing Sheets

METHOD AND APPARATUS FOR ACCURATELY APPLYING STRUCTURES TO A SUBSTRATE

CROSS REFERENCE TO RELATED APPLICATIONS

This is the U.S. National Phase of PCT/NL2005/000298, filed Apr. 22, 2005, which in turn claims priority to Dutch application No. 1026013, filed Apr. 23, 2004 and Dutch application No. 0126880, filed Aug. 19, 2004, all of which are incorporated herein in their entirety by reference.

BACKGROUND OF THE INVENTION

The invention relates to a method and an apparatus for accurately applying lacquer structures to a substrate.

To date, use is often made of masks to locally screen a lacquer, which is used for forming the structures, from lighting. The use of such masks is laborious and expensive. Moreover, for each new structure, a new mask needs to be manufactured. Another problem in applying structures to a substrate is formed by the large amount of lacquer and solvents used therein. Another problem one is faced with is providing structures with sharp outlines. The relative positioning of the structures in the various layers is also an important problem for accurately applying structures to a substrate.

BRIEF SUMMARY OF THE INVENTION

Applications of the method may, for instance, be a method for manufacturing electronic components, such as for instance an OLED, a solar cell, a TFT structure on a display or the like. With these components, it is very important that, in a large number of layers of material which are applied successively, the structures therein are very accurately positioned with respect to one another. Here, a so-called overlay accuracy of at least 2 microns and preferably at least 1 micron is desired.

The invention contemplates a method for applying lacquer structures to a substrate with which at least a number of the above-described problems are solved.

For this purpose, the invention provides a method where, in a scanning step, structures already applied to the substrate are detected by at least one scanning provision of a processing head, while the processing head is provided with at least one lighting provision, which lighting provision locally lights the applied lacquer structure in a lighting step by using the information obtained with the scanning step.

Using the scanning provision of the processing head, positions of already applied structures can be determined very accurately, so that the applied lacquer structure can very accurately be lighted locally. Preferably, the processing head forms a direct mechanical coupling between the scanning and the lighting provision, which is strongly favorable to the positioning accuracy.

In this context, the term "lighting" is to be understood in a broad sense. "Lighting" is not only understood to mean treatment with visible light, but also with UV radiation, IR radiation, ion beam and E beam. The lighting results in a change of the structure of the lacquer, for instance in that the lacquer cross-links or in that the solvent is removed from the lacquer. The term "lacquer" is also to be understood in a broad sense. Possibilities are photoresist, UV-curing lacquer, PPV and PDOT for the purpose of manufacturing OLEDs, and the like.

Through the lighting step, carried out by the lighting provision, structures with fine, sharp boundaries can be obtained.

A local lighting step is not understood to mean a lighting step using a mask, but locally lighting the lacquer with the aid of one narrow beam or with an array of narrow beams, which are each individually controllable. With such a narrow beam or array of individually controllable narrow beams—which may for instance be laser beams, infrared beams, visible-light beams, UV beams, ion beams or E beams—the desired structure can be written in the lacquer, as it were. The lighting can take place in those areas where the lacquer needs to be removed or, conversely, in those areas where the lacquer needs to remain present, depending on the lacquer used.

According to an aspect of the invention, the information obtained with the scanning step is also used for depositing the lacquer structure at a desired position. In this manner, the new lacquer structure can accurately be positioned with respect to the existing structure.

According to a further elaboration of the method, the processing head may also be provided with an inkjet printing provision, where a complete lacquer layer or a lacquer structure is applied to the substrate in an inkjet printing step using the inkjet printing provision of the processing head. Preferably, in the inkjet printing step, the lacquer is applied locally for forming a lacquer structure.

In this manner, the depositing of the lacquer is effected by means of an advantageous printing technique. Because the inkjet printing is used, instead of completely covering the substrate with lacquer, the lacquer can be used in a much less wasteful manner. This is because the lacquer only needs to be applied where the forming of structures is desired. Incidentally, the invention does not preclude the possibility that, with the inkjet printing provision, a complete lacquer layer is applied to the substrate instead of a lacquer structure.

Further, in this manner, the processing head is provided with both the inkjet printing provision and with the lighting provision. In that case, in one movement of the processing head with respect to the substrate, both the delivery of lacquer and the lighting of the lacquer just applied can be realized. In this manner, the position of the lighting provision is, moreover, directly mechanically coupled to the position of the processing head. As a result, after the application of the lacquer, it can be determined with great accuracy where this lacquer is then lighted using the lighting provision. The direct coupling of the position of the processing head with the lighting provision practically excludes the possibility of the lighting provision carrying out a lighting operation at wrong positions on the substrate. With the local lighting step, the relatively inaccurate outlines of the lacquer applied with the inkjet technique can be "cut off", so that lighted structures with fine, sharp boundaries are obtained.

According to a further elaboration of the invention, a scanning step can be carried out immediately prior to the inkjet printing step in that a first scanning provision is provided on the processing head, and that on the upstream side of the inkjet printing provision, viewed in the relative direction of movement of the processing head with respect to the substrate. With such a scanning step, it is known where the already applied structures are located on the substrate, so that, directly after the scanning step—in the printing step—new structures can accurately be positioned with respect to these structures already present on the substrate.

However, it would further be advantageous to immediately check the structure just applied and lighted, for instance to determine whether the lacquer has been applied everywhere in the right manner. For this purpose, according to a further elaboration of the invention, a scanning step can be carried out immediately after the inkjet printing step in that a second scanning provision is provided on the processing head, and that on the downstream side of the inkjet printing provision, viewed in the relative direction of movement of the processing head with respect to the substrate.

Here, using the information obtained with the second scanning provision, it can be determined whether printing has taken place where it should have and, if this is not the case, the lacquer can still be printed at the desired positions in a second printing step. For this purpose, the head can go through a forward and backward movement over the same area of the substrate. If it is detected with the second scanning provision that to some areas the lacquer has not yet been applied, lacquer can still be deposited and lighted in those areas in the backward movement.

According to an aspect of the invention, a scanning step is carried out immediately prior to the lighting step in that a first scanning provision is provided on the processing head, and that on the upstream side of the lighting provision, viewed in the relative direction of movement of the processing head with respect to the substrate.

In this manner, in one movement of the processing head with respect to the substrate, it can be determined where the applied lacquer structure is to be lighted locally, while the lighting of the lacquer can be carried out in the same movement of the processing head. It is then advantageous according to the invention if a scanning step is carried out immediately after the lighting step in that a second scanning provision is provided on the processing head, and that on the downstream side of the lighting provision, viewed in the relative direction of movement of the processing head with respect to the substrate. Thus, using the information obtained with the second scanning provision, it can determined whether lighting has taken place where it should have and, if this is not the case, the lacquer is still lighted at the desired positions in a second lighting step. Also in this case, for this purpose, the head can go through a forward and a backward movement over the same area of the substrate. If it is detected with the second scanning provision that the lacquer has not yet been lighted in some areas, lacquer can still be lighted in those areas in the backward movement. Detecting a desired lighting may, for instance, take place on the basis of an expected change of the lacquer, which change is realized under the influence of the lighting. Such a change may, for instance, be a change in color, structure and/or shape of the lacquer.

Detecting in a second scanning step whether lacquer has been lighted at a desired position can of course be combined with detecting whether lacquer has been deposited at a desired position, at least if a lacquer deposition step has also been carried out before this second scanning step. In this manner, the lacquer can relatively rapidly and accurately be deposited as well as lighted, preferably during the forward and backward movements of the processing head.

Further, information obtained with the second scanning provision can also be fed back to a measuring system with the aid of which the position of the processing head is controlled. When new structures in a next layer are far removed from a previously applied structure, such a feedback to a measuring system is important because no direct reference can be made to the previously applied structures during the movement of the head over the substrate.

According to a further embodiment of the invention, the lacquer structure can be applied for the purpose of creating a structure in a material layer applied or to be applied to the substrate.

Such processes are known per se and may, for instance, comprise etching away a material layer which is partly covered with the lacquer structure. Applying material layers to and/or between the lacquer structures as for instance described in U.S. Pat. No. 3,832,176 (a fill-in process) and U.S. Pat. No. 4,674,174 (a lift-off process) is also one of the possibilities.

Here, the material layer may, for instance, be a metal, such as for instance molybdenum, chromium, etc., a semiconductor, a dielectric layer, such as for instance $SiO_x$, $SiN_x$, or ITO. However, a plurality of different substances are also possible.

The steps of the method according to the invention may be part of a method for manufacturing an electronic component, such as for instance a TFT structure, an OLED, a solar cell or the like.

The lacquer structure may be formed by a photoresist structure or by a lacquer curing rapidly under the influence of a lighting operation, such as for instance a UV-curing lacquer. It is also possible that the structure of the lacquer is changed by removing a solvent from the lacquer using the lighting, for instance using IR lighting.

Preferably, in the application of the successive structures, an overlay accuracy is achieved of at least 0.7 micron, more particularly at least 0.4 micron.

For this purpose, the measurements in the scanning step may, for instance, be based on an interferometric measurement, a triangulation measurement or image recognition.

A very accurate local lighting can be carried out using an array of individually controllable lasers, LEDs or similar lighting means which can quickly be switched on and off or modulated with the aid whereof a respective lacquer can be lighted.

The invention further relates to an apparatus for carrying out a method according to any one of claims 1-18, wherein the apparatus according to the invention is provided with a processing head which is movable relative to a substrate carrier, wherein the processing head comprises at least one scanning provision and at least one lighting provision.

Using the processing head, a desired structure may, for instance, be written in a lacquer applied immediately before that. In order to accurately position the processing head with the lighting provision with respect to already applied structures, the processing head comprises at least one scanning provision. Using this at least one scanning provision, already applied structures can be detected, so that an accurate lacquer lighting can be carried out by the lighting provision.

The lighting provision needs to generate at least one, but preferably an array of individually controllable narrow beams, such as for instance laser beams, infrared beams, visible-light beams, UV beams, E beams or ion beams, so that very fine structures can be positioned and formed in the lacquer with great accuracy.

According to a further elaboration of the apparatus, the processing head is further provided with an inkjet printing provision. With such an inkjet printing provision, instead of a complete lacquer layer, lacquer structures can be formed, which results in a saving on the lacquer use.

Here, it is more particularly preferred if the processing head is provided with two lighting provisions, while a first lighting provision is arranged upstream and a second lighting provision is arranged downstream of the inkjet printing provision, viewed in the relative direction of movement of the substrate with respect to the processing head. With such a head, in two directions of movement, lacquer can be applied and be lighted immediately afterwards.

Further, the processing head is preferably provided with two scanning provisions, while a first scanning provision is arranged upstream and a second scanning provision is arranged downstream of the inkjet printing provision, viewed in the relative direction of movement of the substrate with respect to the processing head. With such a head, both prior to applying the lacquer and immediately afterwards, scanning can take place during the relative movement of the head with respect to the substrate. The measurements carried out during scanning can be used for regulating the delivery of lacquer with the aid of the processing head in a backward movement of the processing head. In addition, the measurements can be used for positioning the structures in the lacquer with the aid of the lighting provision.

According to an aspect of the invention, for this purpose, the processing head is provided with two scanning provisions, while a first scanning provision is arranged upstream and a second scanning provision is arranged downstream of the at least one lighting provision, viewed in the relative direction of movement of the substrate with respect to the processing head.

As a result, both prior to lighting the lacquer and immediately afterwards, scanning can take place during the relative movement of the head with respect to the substrate. In this case, the measurements carried out during scanning can be used for regulating the lacquer lighting with the aid of the processing head in a backward movement of the processing head. In this manner, it can be determined whether lighting has taken place where it should have and, if this is not the case, the lacquer can still be lighted at the desired positions in a second lighting step.

Because the head is provided with two scanning provisions, lacquer can moreover be lighted accurately in two directions of movement of the head.

In order to expose the substrate to vibrations and similar conditions causing inaccuracy as little as possible, it is preferred to arrange the processing head so as to be movable relative to the fixed world, while the substrate carrier is stationary, at least during the carrying out of the inkjet printing step and the lighting step of the method.

It will be clear that the apparatus is provided with a control arranged for processing information obtained with the at least one scanning provision, which control is further arranged for controlling the movement of the processing head, and controlling the at least one lighting provision. Further, the control may also be arranged for controlling the various nozzles of the inkjet printing provision.

The scanning provision may be arranged for carrying out, for instance, an interferometric measurement, a triangulation measurement or image recognition. Such measurements provide a very high accuracy.

The at least one lighting provision for creating the at least one narrow beam may comprise an array of individually controllable lasers, LEDs or similar lighting means which can quickly be switched on and off or modulated, with the aid of which a respective lacquer can be lighted locally.

BRIEF DESCRIPTION OF THE DRAWINGS

The invention will now be explained in more detail on the basis of an exemplary embodiment, with reference to the drawing, in which.

DETAILED DESCRIPTION OF THE INVENTION

Figure 1:
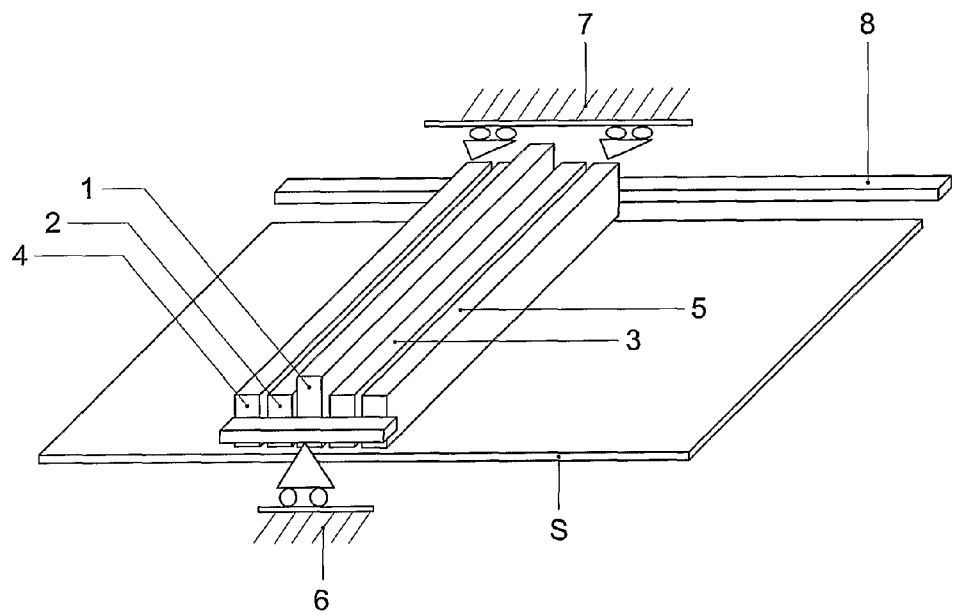
FIG. 1 shows a diagrammatic perspective view of a combined inkjet printhead with double lighting provision and double scanning provision.

FIG. 1 shows a substrate S and an inkjet printhead 1 comprising a rod-shaped array of nozzles. On both sides of the inkjet printhead 1, a rod-shaped lighting provision 2, 3 and a rod-shaped scanning provision 4, 5 are fixedly connected with the inkjet printhead 1. Each rod-shaped lighting provision 2, 3 comprises an array of LEDs, lasers or the like which can be modulated individually for intensity, for instance in that they can be switched on and off individually. Each rod-shaped scanning provision 4, 5 comprises an array of sensors. The head as a whole is bearing-mounted with guides 6, 7 and provided with a drive 8 with the aid of which the head can be moved over the substrate S. In a movement of the head over the substrate S, using a scanning rod 4, 5, structures already applied to the substrate S can be detected and, depending thereon, using the inkjet printhead 1, the lacquer can be deposited on the substrate at the desired moment, such that the position of the lacquer is adjusted to the positions of the previously applied structures. Further, in the same movement, the lacquer can be lighted directly using the lighting rods 2, 3, while use can also be made of the positions of the already applied structures detected with the scanning rods 4, 5. Because lighting rods 2, 3 and scanning rods 4, 5 are provided on both sides of the inkjet printhead 1, the steps of scanning, printing and lighting can be carried out both in a forward and a backward movement. In addition, as a result of the double scanning rod 4, 5, the printed and lighted structure can be measured directly and, optionally, on the basis of the measurements, a second printing, lighting and a second scanning step can be gone through for correcting possibly incomplete structures applied in the first printing and lighting step.

FIGS. 2-14 show an example of a process of which the method according to the invention is part. The process shown is exclusively an example and is particularly suitable for manufacturing, for instance, a TFT structure on a substrate. The method for applying lacquer structures may also be used in different processes, for instance in processes as described in U.S. Pat. No. 3,832,176 and U.S. Pat. No. 4,674,174. Further, the method may also be used for accurately applying PDOT and PPV or similar organic lacquers to a substrate for manufacturing an OLED or for manufacturing electronic components, such as for instance solar cells.

Figure 2:
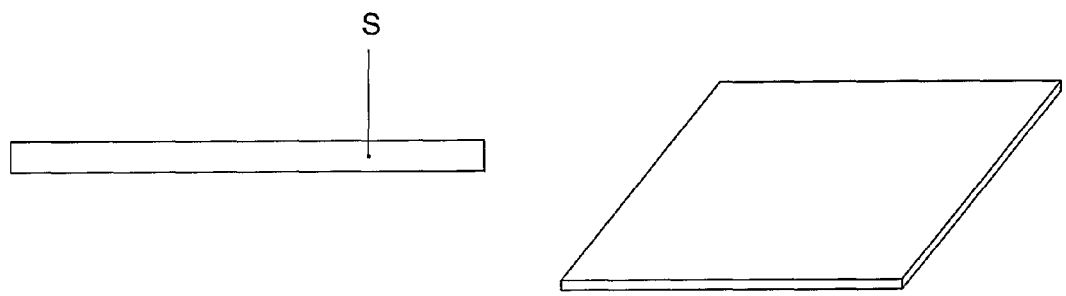
FIGS. 2-14 each show, in a left part, a cross-sectional view and, in a right part, a corresponding perspective view of a substrate undergoing a number of method steps; and finally FIG. 15 diagrammatically shows the various process steps gone through for applying a structure in a layer of material applied to a substrate.
Figure 3:
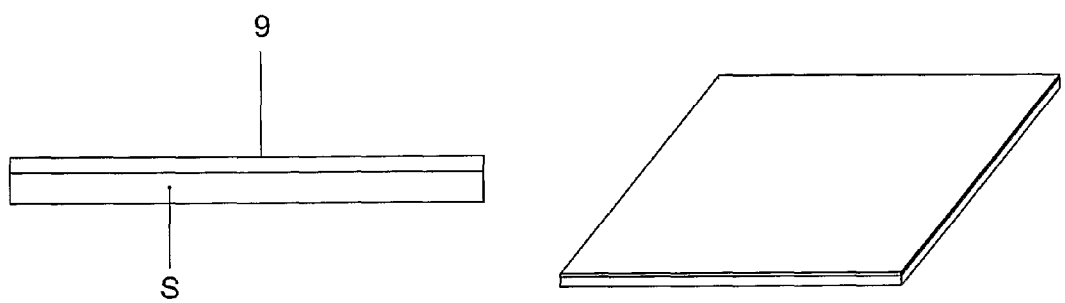
Figure 4:
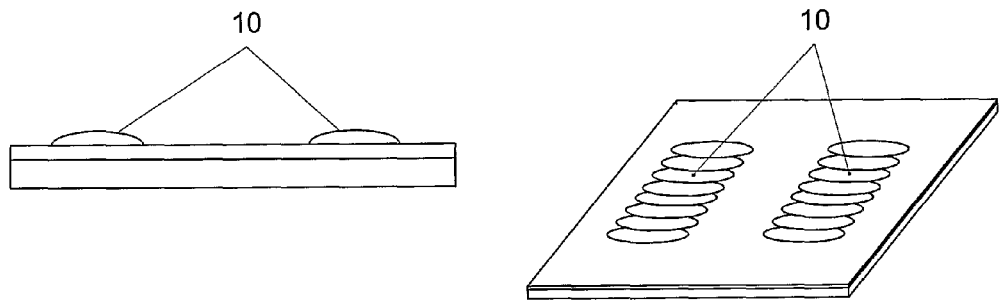
Figure 5:
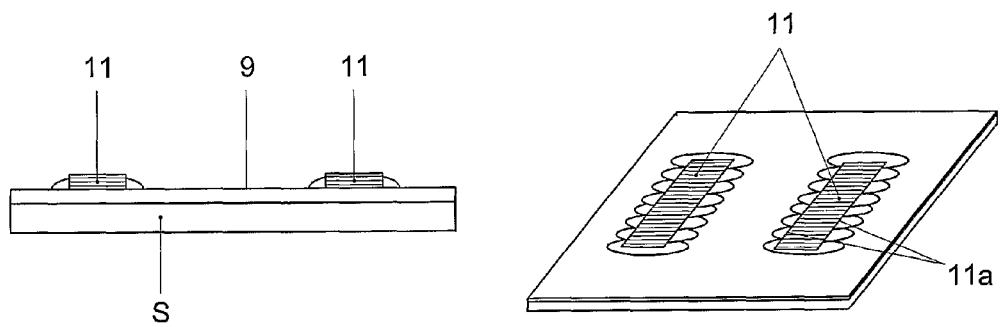
Figure 6:
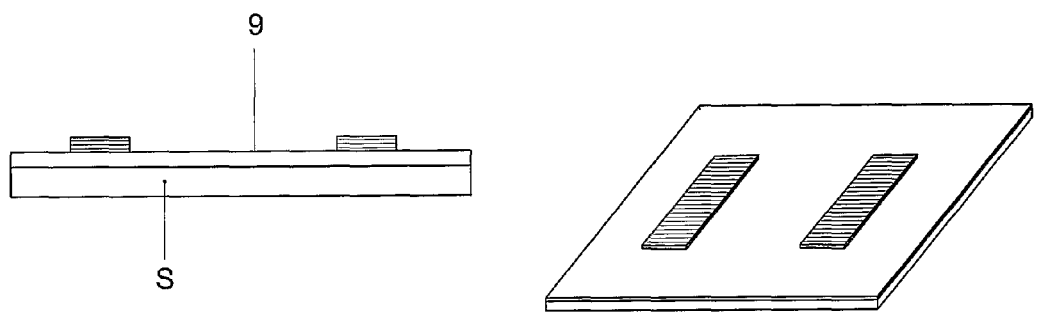
Figure 7:
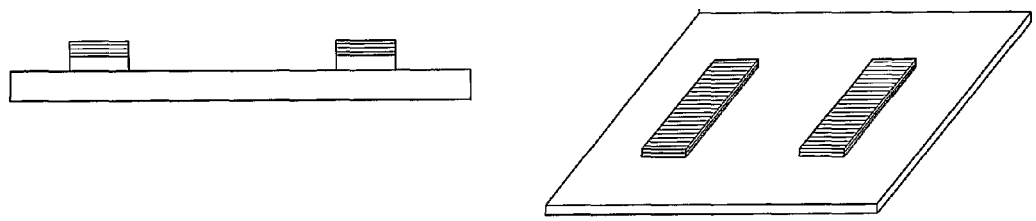

FIG. 2 shows a substrate S. FIG. 3 shows the same substrate after the deposition of a layer of material 9 on the substrate S over the whole surface of the substrate S (step (a)). FIG. 4 then shows the substrate S after the inkjet printing step (step (b)) of the method has been gone through. With some overmeasure, using inkjet printing, the desired structure has been applied to the substrate S in the form of a lacquer 10, such as for instance photoresist or a different lacquer changing its structure under the influence of electromagnetic radiation (UV, visible, IR), E beam or ion beam. Instead of local application of the lacquer, full-surface printing of the lacquer could also be used. FIG. 5 shows the substrate S after it has gone through the lighting step (step (c)). Clearly visible are the sharp boundaries 11a of the structures 11 which have been applied using the lighting. FIG. 6 then shows the substrate S after a developing step (step (d)) has been gone through, i.e. after the lacquer has been developed and the lighted lacquer has been preserved and the non-lighted lacquer parts have been removed or vice versa. FIG. 6 clearly shows that the layer of material 9 in which the structure is to be provided is still completely present. Then, an etching step (step (e)) is gone through of which the result is shown in FIG. 7. It is clearly visible that the material layer 9 has now substantially been removed with the exception of the structure areas where the lacquer structure 11 is still present.

Figure 8:
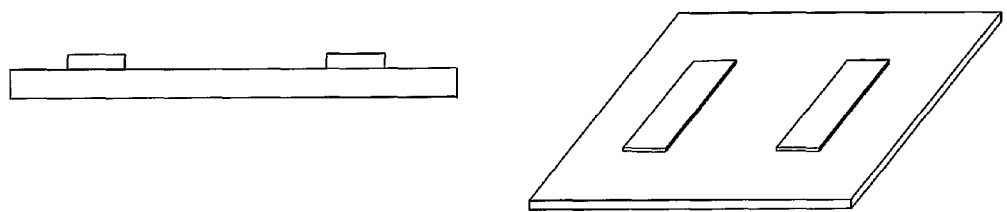
Figure 9:
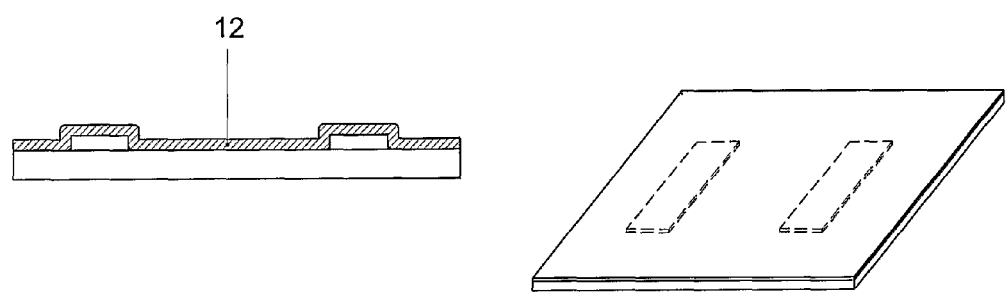
Figure 10:
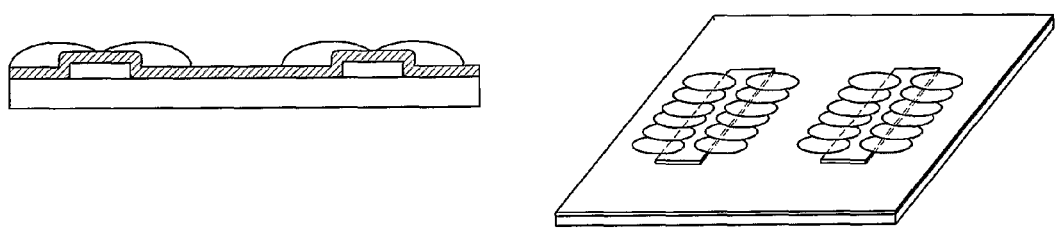
Figure 11:
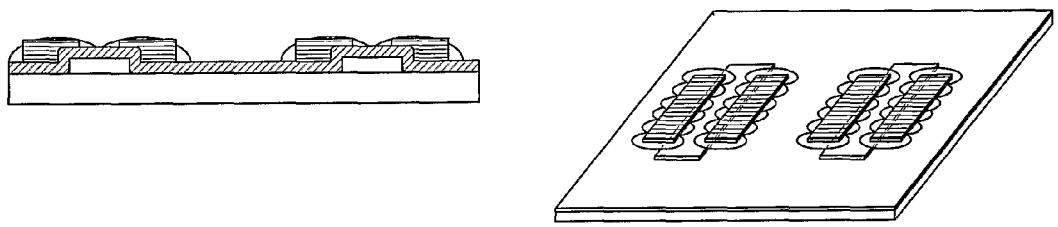
Figure 12:
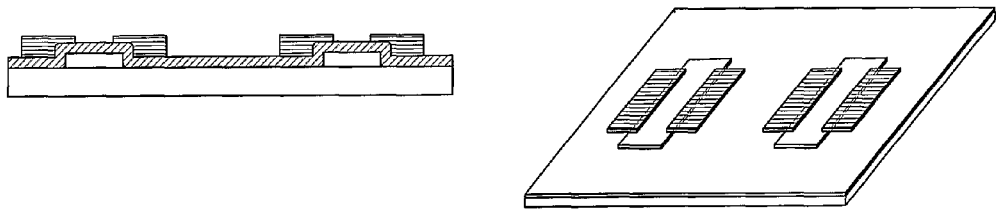
Figure 13:
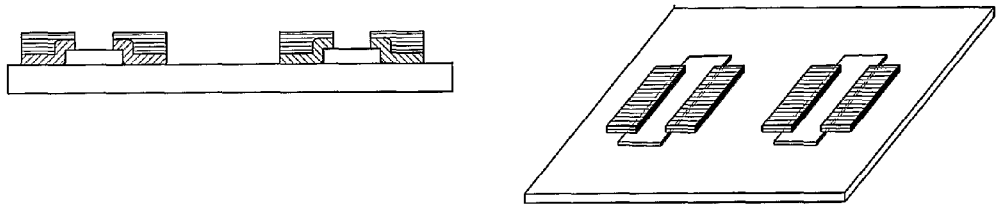
Figure 14:
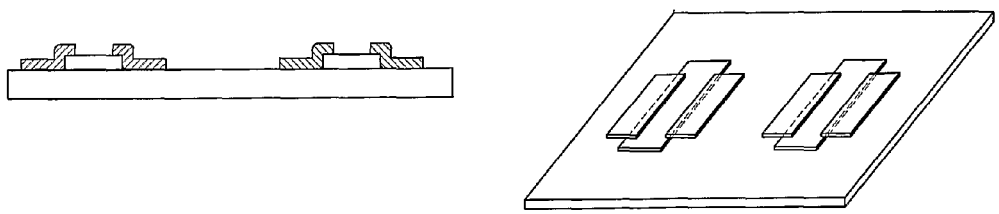

Then, using an incineration step, the cured lacquer 11 which is still present is removed (step (f)). The result thereof is shown in FIG. 8. Removing the cured lacquer which is still present can also be carried out using solvents.

In FIGS. 9-14, the respective steps (a)-(f) are again repeated for applying a structure in a second material layer 12 which has been deposited on the previous material layer 9 and the substrate S. It goes without saying that the process can be repeated a further number of times for applying an accumulation of different structures applied in successive material layers.

Figure 15:
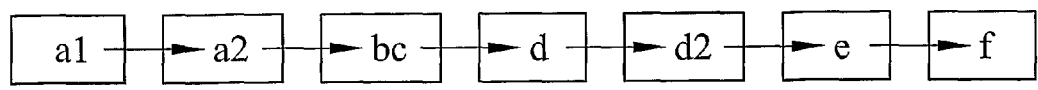

Finally, FIG. 15 diagrammatically shows a number of blocks which each represent a processing station in which the various steps carried out per processing station are shown.

In block a1, deposition of the material 9 on the substrate S takes place;

in block a2, the deposited material is cleaned (this step is not necessary for all materials);

in block bc, the printing, lighting and scanning takes place;

in block d, the lacquer is developed, whereby the lighted lacquer structure is preserved and the non-lighted lacquer parts are removed or vice versa;

in block d2, the remaining lacquer structure is baked to cure it further;

in block e, the excess material is etched away. Only under the lacquer structures which are still present, the material remains present during the etching treatment, which is intended;

in block f, the remaining cured lacquer structure is then removed using, for instance, an incineration step or using solvents.

It will be clear that the invention is not limited to the exemplary embodiment described.

The description of the figures each time refers to an inkjet printhead because, in the exemplary embodiment, the head is provided with an inkjet printing provision 1. It already appears from the claims that one main provision on the head is the at least one lighting provision, while another main provision is the scanning provision; this is why the term processing head is used in the claims. Therefore, the invention also comprises an embodiment in which the head is not provided with an inkjet printing provision but only with at least one lighting provision, supplemented with at least one scanning provision. In the latter case, the head may, for instance, be referred to as a lighting head.

Further, for instance, processing steps may be added between the processing steps described. Here, possibilities are cleaning steps for, for instance, removing waste created after the incineration step. Also, instead of horizontal, the orientation of the substrate could, for instance, be vertical. Further, instead of the inkjet printhead, the substrate could move and the inkjet printhead could be stationary. As already indicated hereinabove, the method may also be used in completely different processes, namely processes in which the accurate application of a lacquer locally undergoing a structure change due to lighting with electromagnetic radiation (IR, visible and/or UV), E beam or ion beam plays a role.

In order to calibrate the apparatus, use may be made of a calibration grid placed in the apparatus instead of a substrate.

Further, a substrate may already have been provided with a lacquer layer in different manners, for instance by spin coating, spraying or immersion.

The invention claimed is:

1. A method comprising:
   using a single processing head to:
   perform a first scan of a substrate having a plurality of structures formed thereon to detect the structures and to determine locations where applied lacquer structures are to be lighted locally;
   after the first scan, locally lighting applied lacquer structures according to the locations determined in the first scan so as to align the lighted applied lacquer structures with the structures formed on the substrate; and
   after the local lighting, performing a second scan of said applied lacquer structures so as to determine actual locations of the local lighting with respect to the structures formed on the substrate.

2. A method according to claim 1, wherein the information obtained by the first scan is also used for depositing the lacquer structure at a desired position.

3. A method according to claim 1, wherein the processing head is further provided with an inkjet printing provision, wherein, in an inkjet printing, a complete lacquer layer or a lacquer structure is applied to the substrate using the inkjet printing provision of the processing head, wherein, in the inkjet printing, the lacquer is applied locally to the substrate for forming a lacquer structure.

4. A method according to claim 3, wherein said first scan is carried out immediately prior to the inkjet printing using a first scanning provision provided on the processing head, on the upstream side of the inkjet printing provision, viewed in the relative direction of movement of the processing head with respect to the substrate.

5. A method according to claim 3, wherein said second scan is carried out immediately after the inkjet printing using a second scanning provision provided on the processing head, on the downstream side of the inkjet printing provision, viewed in the relative direction of movement of the processing head with respect to the substrate.

6. A method according to claim 5, wherein, using the information obtained with the second scanning provision, it is determined whether printing has taken place where it should have and wherein, if this is not the case, the lacquer is still printed at the desired positions in a second printing.

7. A method, according to claim 1, wherein said first scan is carried out immediately prior to the lighting using a first scanning provision provided on the processing head on the upstream side of a lighting provision, viewed in the relative direction of movement of the processing head with respect to the substrate.

8. A method according to claim 7, wherein said second scan is carried out immediately after the local lighting using a second scanning provision provided on the processing head, on the downstream side of a lighting provision, viewed in the relative direction of movement of the processing head with respect to the substrate.

9. A method according to claim 8, wherein, using the information obtained with the second scanning provision, it is determined whether lighting has taken place where it should have and wherein, if this is not the case, the lacquer is still lighted at the desired positions in a second lighting.

10. A method according to claim 5, wherein the information obtained with the second scanning provision is further fed back to a measuring system such that the position of the processing head is controlled.

11. A method according to claim 1, wherein the lacquer structure is applied so as to create a structure in a material layer applied or to be applied to the substrate.

12. A method according to claim 11, wherein the material layer comprises:
   a metal selected from the group consisting of: molybdenum and chromium;

a semiconductor; or
a dielectric layer selected from the group consisting of: $SiO_x$, $SiN_x$, and ITO.

13. A method according claim 1, wherein the said applied lacquer structures are used for manufacturing an electronic component selected from the group consisting of: a TFT structure, an OLED, and a solar cell.

14. A method according to claim 1, wherein the lacquer structure is formed by a photoresist structure.

15. A method according to claim 1, wherein the lacquer structure is formed by a lacquer changing its structure or composition by the local lighting.

16. A method according to claim 1, wherein, in the application of the successive structures, an overlay accuracy is achieved of at least 0.7 micron or less.

17. A method according to claim 1, wherein, in at least one of the scan, an interferometric measurement or a triangulation measurement or image recognition is carried out.

18. A method according to claim 1, wherein the local lighting is carried out using an array of individually controllable lasers, LEDs or a lighting device which is configured to be switched on and off or modulated, such that a respective lacquer structure can be lighted.

19. An apparatus comprising:
a substrate carrier configured to hold a substrate;
a processing head which is movable relative to the substrate carrier, wherein the processing head comprises:
at least one lighting provision;
a first scanning provision positioned on an upstream side of the at least one lighting provision, viewed in the relative direction of movement of the substrate with respect to the processing head, and configured to detect structures formed on a substrate; and
a second scanning provision positioned on a downstream side of the at least one lighting provision, and configured to scan the substrate; and
a controller configured to:
perform a first scan of a substrate having a plurality of structures formed thereon using the first scanning provision to detect the structures and to determine locations where applied lacquer structures are to be lighted locally;
after the first scan, locally lighting applied lacquer structures according to the locations determined in the first scan using the at least one lighting provision so as to align the lighted applied lacquer structures with the structures formed on the substrate; and
after the local lighting, performing a second scan of said applied lacquer structures using the second scanning provision so as to determine actual locations of the local lighting with respect to the structures formed on the substrate.

20. An apparatus according to claim 19, wherein the processing head is further provided with an inkjet printing provision.

21. An apparatus according to claim 20, wherein the processing head is provided with two lighting provisions, wherein a first lighting provision is provided upstream of and a second lighting provision is provided downstream of the inkjet printing provision, viewed in the relative direction of movement of the substrate with respect to the processing head.

22. An apparatus according to claim 20, wherein the first scanning provision is provided upstream of and the second scanning provision is provided downstream of the inkjet printing provision, viewed in the relative direction of movement of the substrate with respect to the processing head.

23. An apparatus according to claim 19, wherein the processing head is arranged so as to be movable relative to the substrate carrier being held stationary, at least during the carrying out of the local lighting.

24. An apparatus according to claim 19, provided with a control arranged for processing information obtained with the at least one of the scanning provisions, which control is further arranged for controlling the movement of the processing head, and controlling the at least one lighting provision.

25. An apparatus according to claim 24, wherein the control is further arranged for controlling various nozzles of an inkjet printer.

26. An apparatus according to claim 19, wherein at least one of the scanning provisions is arranged for carrying out an interferometric measurement, a triangulation measurement or image recognition.

27. An apparatus according to claim 19, wherein the lighting provision comprises an array of individually controllable lasers, LEDs or a lighting device which are configured to be switched on and off or modulated, such that the respective lacquer structure can be lighted locally.

28. A method comprising:
using a single processing head to:
perform a first scan of a substrate having a plurality of structures formed thereon to detect the structures and to determine locations where applied lacquer structures are to be formed;
after the first scan, applying lacquer locally to the structures formed on the substrate so as to form applied lacquer structures according to locations determined in the first scan to align the lacquer structures with the structures formed on the substrate; and
locally lighting the applied lacquer structures according to the locations determined in the first scan to align the lighted lacquer structures with the structures formed on the substrate.

29. A method according to claim 28, wherein the first scan is carried out immediately prior to the local lighting in that a first scanning provision is provided on the processing head, on the upstream side of the lighting provision, viewed in the relative direction of movement of the processing head with respect to the substrate.

30. A method according to claim 29, wherein a second scan is carried out immediately after the local lighting in that a second scanning provision is provided on the processing head, on the downstream side of the lighting provision, viewed in the relative direction of movement of the processing head with respect to the substrate.

31. A method according to claim 30, wherein, using the information obtained with the second scanning provision, it is determined whether lighting has taken place where it should have and wherein, if this is not the case, the lacquer is still lighted at the desired positions in a second lighting.

32. A method according to claim 28, wherein the processing head is provided with a first scanning provision on an upstream side of an inkjet printing provision, viewed in the relative direction of movement of the processing head with respect to the substrate,
the method further comprising:
providing the processing head with a second scanning provision on the downstream side of the inkjet printing provision; and
carrying out a second scan using the second scanning provision immediately after the printing.

33. A method according to claim 32, wherein, using the information obtained with the second scanning provision, it is determined whether printing has taken place where it should have and wherein, if this is not the case, the lacquer is still printed at the desired positions in a second printing.

34. A method according to claim 32, wherein the information obtained with the second scanning provision is further fed back to a measuring system such that the position of the processing head is controlled.

35. A method according to claim 28, wherein the lacquer structure is applied in order to create a structure in a material layer applied or to be applied to the substrate.

36. A method according to claim 35, wherein the material layer comprises:
   a metal selected from the group consisting of: molybdenum and chromium;
   a semiconductor; or
   a dielectric layer selected from the group consisting of: $SiO_x$, $SiNi_x$, and ITO.

37. A method according to claim 28, wherein, in the application of the successive structures, an overlay accuracy is achieved of at least 0.7 micron or less.

38. A method according to claim 28, wherein, in the first scan, an interferometric measurement or a triangulation measurement or image recognition is carried out.

39. A method according to claim 28, wherein the local lighting is carried out using an array of individually controllable lasers, LEDs or a lighting device which is configured to switched on and off or modulated, such that a respective lacquer structure can be lighted.

40. An apparatus comprising:
   a substrate carrier configured to hold a substrate;
   a processing head which is movable relative to the substrate carrier, the processing head comprising:
      an inkjet printing provision configured to apply lacquer;
      a first scanning provision that is provided on the upstream side of the inkjet printing provision, viewed in the relative direction of movement of the processing head with respect to the substrate and configured to detect structures formed on a substrate;
      at least one lighting provision configured to locally light structures on a substrate; and
   a controller configured to:
      perform a first scan of a substrate having a plurality of structures formed thereon using the first scanning provision to detect the structures and to determine locations where applied lacquer structures are to be formed;
      after the first scan, applying lacquer locally to the structures formed on the substrate using the inkjet printing provision so as to form applied lacquer structures according to locations determined in the first scan to align the lacquer structures with the structures formed on the substrate; and
      locally lighting the applied lacquer structures according to the locations determined in the first scan using the at least one lighting provision to align the lighted lacquer structures with the structures formed on the substrate.

41. An apparatus according to claim 40, wherein the processing head is provided with two lighting provisions, wherein a first lighting provision is provided upstream of and a second lighting provision is provided downstream of the inkjet printing provision, viewed in the relative direction of movement of the substrate with respect to the processing head.

42. An apparatus according to claim 40, wherein the processing head is provided with a second scanning provision is downstream of the inkjet printing provision, viewed in the relative direction of movement of the substrate with respect to the processing head.

43. An apparatus according to claim 42, wherein the first scanning provision is provided upstream of and the second scanning provision is provided downstream of the at least one lighting provision, viewed in the relative direction of movement of the substrate with respect to the processing head.

44. An apparatus according to claim 40, wherein the inkjet printing provision includes a plurality of nozzles and the controller being arranged for controlling the nozzles of the inkjet printing provision.

45. An apparatus according to claim 40, wherein the first scanning provision is arranged for carrying out an interferometric measurement, a triangulation measurement or image recognition.

46. An apparatus according to claim 40, wherein the lighting provision comprises an array of individually controllable lasers, LEDs or a lighting device which is configured to be switched on and off or modulated, such that the respective lacquer structure can be lighted locally.

* * * * *